United States Patent [19]

Ho et al.

[11] Patent Number: 5,354,712
[45] Date of Patent: Oct. 11, 1994

[54] METHOD FOR FORMING INTERCONNECT STRUCTURES FOR INTEGRATED CIRCUITS

[75] Inventors: Yu Q. Ho, Kanata; Gurvinder Jolly, Orleans; Ismail T. Emesh, Cumberland, all of Canada

[73] Assignee: Northern Telecom Limited, Montreal, Canada

[21] Appl. No.: 974,760

[22] Filed: Nov. 12, 1992

[51] Int. Cl.$^5$ .................. H01L 21/283; H01L 21/304
[52] U.S. Cl. .................. 437/195; 437/190; 437/192; 437/228; 156/636
[58] Field of Search .............. 156/636; 437/190, 228, 437/192, 195

[56] References Cited

U.S. PATENT DOCUMENTS

| | | | |
|---|---|---|---|
| 4,822,753 | 4/1989 | Pintchovski et al. | 437/192 |
| 4,954,214 | 9/1990 | Ho | 156/628 |
| 5,063,175 | 11/1991 | Broadbent | 437/190 |
| 5,084,413 | 1/1992 | Fujita et al. | 437/189 |
| 5,091,339 | 2/1992 | Carey | 437/187 |
| 5,124,780 | 6/1992 | Sandhu et al. | 437/190 |
| 5,219,789 | 6/1993 | Adan | 437/192 |
| 5,225,034 | 7/1993 | Yu et al. | 156/636 |

OTHER PUBLICATIONS

"Use of Chem-Mech Polishing to Enhance Selective CVD-W", *IBM Technical Disclosure Bulletin,* vol. 34, No. 7B, Dec. 1991 p. 87.
SurfaceTech Review, "Planarization: Reading Between the Lines", Rodel, vol. 1, Issue 8, Mar. 1990, pp. 1–7.
S. Wolf, *Silicon Processing for the VLSI Era,* vol. 2, Lattice Press, Sunset Beach, Calif., pp. 124–126.
"New OMCVD Precursors for Selective Copper Metallization", Norman, J. T. et al, 1991 IEEE VMIC Conference Proceedings, Jun. 11–12, 1992, pp. 123–129.

*Primary Examiner*—T. N. Quach
*Attorney, Agent, or Firm*—Angela C. de Wilton

[57] ABSTRACT

A method is provided for forming interconnect structures for ULSI integrated circuits. Preferably, a barrier layer of a conductive material which forms a seed layer for metal deposition is provided selectively on the sidewalls and bottom of interconnect trenches defined in a dielectric layer, and a conformal layer of metal is selectively deposited on the barrier layer within the interconnect trench. Advantageously, the metal layer forming interconnect comprises a layer of copper which is deposited by chemical vapour deposition from an organo-metallic precursor at low temperature. Etching back and planarization of the barrier layer and the metal layer is accomplished by chemical mechanical polishing. Second and subsequent levels of metallization are provided by repeating the process steps, as required, to provide another dielectric layer defining interconnect trenches, selectively lining the trenches with a conformal barrier layer and then filling the trenches with selective deposition of a conformal conductive layer of metal, with planarization of the resulting conformal layers by chemical mechanical polishing. Preferably, via holes forming contacts to underlying device structures are filled with copper or tungsten.

21 Claims, 3 Drawing Sheets

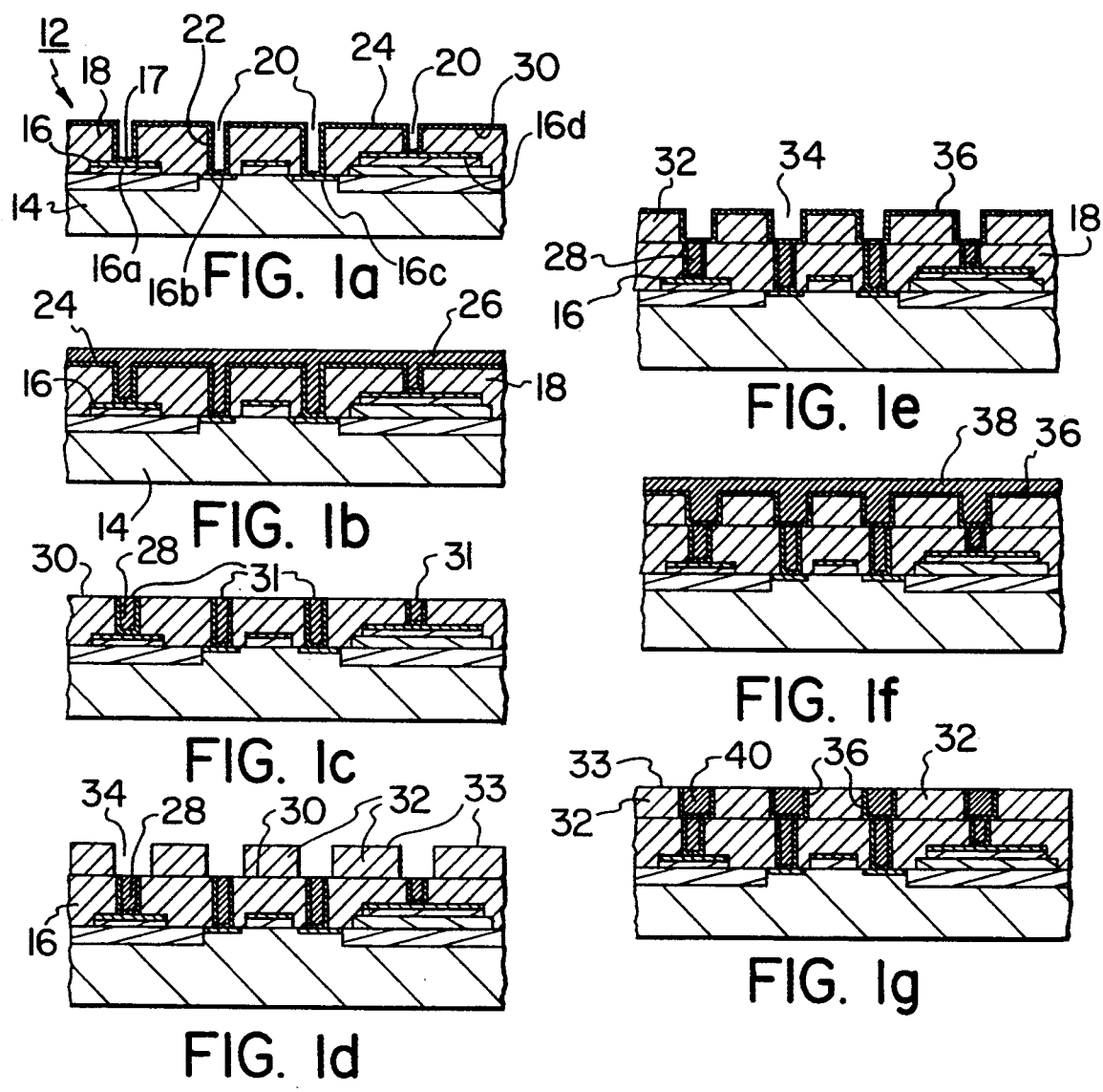

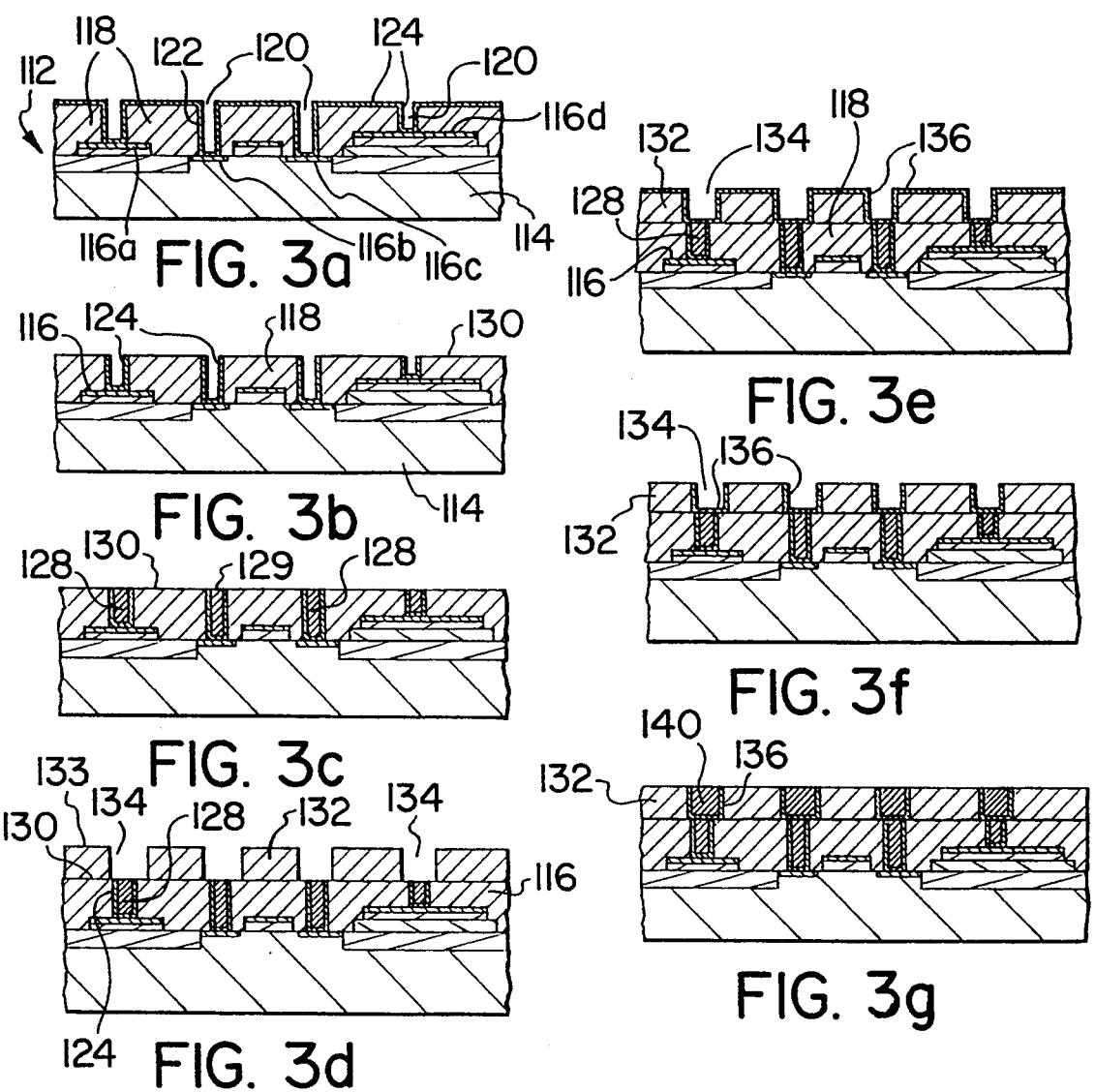

METHOD FOR FORMING INTERCONNECT STRUCTURES FOR INTEGRATED CIRCUITS

FIELD OF THE INVENTION

This invention relates to interconnect structures and a method of forming interconnect structures for integrated circuits.

BACKGROUND OF THE INVENTION

Individual semiconductor devices in VLSI (Very Large Scale Integration) integrated circuits are interconnected by means of one or more patterned conductive layers comprising a high conductivity metal or metal alloy. Advantageously multilevel metal (MLM) interconnect permits crossing over of interconnection paths in different metal layers, to provide for higher density interconnects.

Multilevel metal interconnects for Metal Oxide Semiconductor (MOS) integrated circuit devices are made conventionally by depositing and patterning alternating layers of a conductive material, typically sputtered aluminum alloys such as Al—Si, and layers of an insulating dielectric material, typically $SiO_2$. Small holes or contact vias through the dielectric layers are filled with conductive material to permit interconnection of the conductive layers. However, the surface topography resulting from superposition of several patterned layers may be highly non-planar. Poor step coverage of the metal layer, particularly within submicron contact holes and vias, or poor coverage of dielectric over edges of the metal, may lead to undesirable high resistance or open circuits.

Furthermore, as device dimensions are scaled down for Ultra Large Scale Integration (ULSI) integrated circuits, interconnect lines are subjected to higher current densities, and electromigration of aluminium alloys becomes a major reliability issue. Other conductive materials which have a higher resistance to electromigration are preferred. For example, tungsten has been used for metal interconnect in submicron Bipolar Complementary MOS (BiCMOS) devices. U.S. Pat. No. 4,954,214 to Ho, entitled "Method for Making Interconnect Structures for VLSI Devices", issued September 1990, describes an improved filled interconnect groove (FIG) method using selective chemical vapour deposition of tungsten or electro-less deposition of nickel or other metals for forming interconnect structures. As described by Ho, tungsten may be deposited with excellent step coverage to fill sub-micron, steep sided, vias and trenches.

However, tungsten has a high resistivity, three times greater than that of Al alloys, which causes a substantial increase in RC interconnect delay. Of other suitable conductive materials, copper has recently been proposed for interconnect for sub half micron integrated circuit devices, because copper has both high electromigration resistance and excellent conductivity. The resistivity of copper is about 60% of the resistivity of Al alloys.

On the other hand, conventional known methods of depositing copper do not provide satisfactory step coverage for void free filling of high aspect ratio deep trenches and via holes for sub micron device structures. Furthermore, dry etching of copper and copper containing alloys, using conventional plasma or reactive ion etching processes, is hampered by generation of etch products of copper which have a low vapour pressure (i.e. are non-volatile).

For example, U.S. Pat. No. 5,091,339 to Carey entitled "Trenching Techniques for Forming Vias and Channels in Multilayer Electrical Interconnects" issued February 1992, describes electrolytic deposition of copper for filling vias and trenches lined with a seed layer of sputtered copper over an adhesion layer of sputtered chrome, followed by removal of excess copper by electro-polishing or non-selective polishing. Electrolytic deposition of copper suffers from ridge build up over sharp corners of vias and trenches. Thus, a thick blanket layer of copper must be deposited to ensure complete filling of the via holes and trenches of different depths and the resulting surface is highly non-planar. Consequently, a large amount of excess copper from the thick blanket layer must subsequently be removed by a method of electro-polishing or non-selective polishing.

Other known methods of electro-less deposition of copper, for example, as disclosed in Carey, include sputtering or evaporation to obviate the need for a seed layer. Plasma deposition of copper is also known, but as with the latter methods, step coverage is not satisfactory in high aspect-ratio, deep vias and trenches for ULSI integrated circuit structures.

Chemical vapour deposition of copper has also been pursued for filling submicron features with improved step coverage, as described in an article entitled "New OMCVD Precursors for Selective Copper Metallization" by John A. T. Norman et al., 1991 IEEE VMIC Conference Proceedings, Jun. 11–12, 1991, pages 123 to 129. Subsequent etching of the copper layer was achieved by a reverse vapour phase chemical reaction. However, the latter etch method is isotropic, slow and control of planarity is unsatisfactory for commercially etching ULSI device structures.

Apart from limited etch technology, other problems which are encountered in the use of copper for ULSI integrated circuits include copper diffusion through dielectrics, poor adherence of copper to oxide, and surface passivation of copper.

SUMMARY OF THE INVENTION

The present invention seeks to provide interconnect structures and a method of forming interconnect structures for integrated circuits, in which the above mentioned problems are avoided or reduced.

According to one aspect of the present invention, there is provided a method of forming interconnect structures for devices of an integrated circuit, the devices being formed in a substrate and having an overlying substantially planar first dielectric layer, the dielectric layer having contact holes extending therethrough over contact regions of the devices, and the contact holes being filled with conductive material to provide contacts, the method comprising:

providing a second dielectric layer having a substantially planar surface and defining therein interconnect trenches having steep sidewalls, each interconnect trench extending through the second dielectric layer and exposing selected contacts within a bottom of the trench;

providing a conformal layer of a conductive barrier material over the sidewalls and the bottom of each interconnect trench;

providing a conformal layer of a conductive material, the layer of conductive material being selectively deposited on the barrier layer to a thickness sufficient to fill the interconnect trenches; and selectively removing said conformal layers extending above the planar surface of the second dielectric layer by chemical mechanical polishing.

Thus by providing a thin conformal layer of a barrier material and of a conformal layer of conductive material, for example a low resistivity metal such as copper, both layers conform to the underlying topography so that interconnect trenches of different depths may be filled effectively, with high step coverage and without voids. Where the conformal layer of a barrier material provided within a contact via opening or trench forms a seed layer for subsequent selective growth of a conformal conductive layer of metal, the amount of excess metal which must be deposited to fill the interconnect trenches is reduced compared with deposition of a non conformal layer of metal, and the extent of subsequent etching back to remove excess metallization is reduced. Furthermore, when etching back of excess conformal layers if performed by chemical mechanical polishing, a fully planarized topography is provided, which simplifies provision of second or subsequent layers of interconnect metallization.

Advantageously, the conformal layer of conductive material comprises a layer of metal deposited by chemical vapour deposition from, for example, a volatile, liquid phase metal organic precursor compound of the metal which disproportionates at low temperature, preferably below 400° C. Preferably, a conformal layer of metal is selectively deposited on a suitable seed layer provided on the substrate dielectric layer. Conveniently, a conformal layer of copper for copper interconnect is deposited by CVD from copper (hexafluoroacetylacetonate) trimethyl vinylsilane compound by pyrolysis at low temperatures, between about 120° C. and 400° C., onto a conductive barrier layer of sputtered titanium nitride (TiN), which lines the via holes, and provides a seed layer for selective growth of the conformal layer of copper.

Beneficially, any excess barrier layer and conductive metal layer extending above the surface of the dielectric layer is etched back and planarized by chemical-mechanical polishing to provide a fully planarized topography. A fully planarized topography simplifies subsequent process steps, which may include provision of subsequent layers of interconnect metallization by repeating the latter process steps. Consequently, problems with plasma or reactive ion etching of copper and other metals and alloys by conventional dry etching methods which provide non-volatile etch products are avoided. Thus a process is provided for forming multilayer metallization having copper conductors which is applicable for forming interconnect for ULSI integrated circuits.

Advantageously, the barrier layer is provided selectively in the contact holes or trenches only. Thus when the barrier layer comprises a material which functions as a seed layer for metal deposition, deposition of copper is selective relative to the surrounding dielectric layer. A single deposition step can selectively fill via holes or trenches of differing depth and width by growth of a conformal copper layer, while avoiding or minimizing deposition of copper over the dielectric substrate surface. Thus overall deposition of a blanket layer of copper to fill via holes or trenches is not required, and subsequent etch back and planarization of excess copper extending above the surface of the dielectric layer is minimized or avoided.

Preferably, providing the barrier layer comprises depositing a thin conformal layer of a conductive barrier layer overall and then selectively removing the barrier layer from the substrate surface by chemical mechanical polishing to provide a fully planarized surface having a conductive barrier layer lining the sidewalls and bottom of the via holes only. Subsequent selective growth of the conformal metal layer on the barrier layer is then confined to selectively filling the via holes, and etch back of excess metal from the surface of the dielectric is minimized.

According to another aspect of the present invention there is provided a method of forming interconnect structures for devices of an integrated circuit, comprising:

providing a substrate of an integrated circuit comprising a first dielectric layer having a substantially planar surface, the first dielectric layer having contact holes extending therethrough, each contact hole exposing in a bottom of the hole an electrically conductive region;

filling each of said contact holes with conductive material to provide contacts substantially coplanar with the planar surface of the dielectric layer;

providing a second dielectric layer having a substantially planar surface;

opening interconnect trenches in the second dielectric layer, each interconnect trench having steep sidewalls extending through the dielectric layer and exposing selected contacts within a bottom of the trench;

providing a conformal layer of a conductive barrier material over sidewalls and bottom of each interconnect trench;

providing a conformal layer of a conductive material comprising a metal formed by chemical vapour deposition, the conformal layer being selectively deposited over the barrier layer to a thickness sufficient to fill the interconnect trenches; and planarizing the resulting structure by etching back conductive layers extending above the planar surface of the second dielectric layer by a step of chemical mechanical polishing.

Preferably, the contact via holes are filled by depositing a thin conformal layer of a barrier material to line the via hole and then selectively depositing a layer of a conductive material thereon. The contact holes may be selectively filled with copper, as described above for filling interconnect trenches to provide copper contacts. Alternatively, another metal capable of filling submicron openings with good step coverage, e.g., tungsten deposited by chemical vapour deposition on a suitable barrier layer, e.g. tungsten silicide, may be used to fill the contact holes.

According to a further aspect of the present invention there is provided an interconnect structure for devices of an integrated circuit formed in a substrate, comprising:

a first dielectric layer having a substantially planar surface, the first dielectric layer defining steep sidewalls of a plurality of contact via holes extending therethrough, and each via hole defining a contact area to a conductive region of an underlying device structure, each via hole being lined with a thin conformal barrier layer of a conductive material extending over the sidewall and contact area at the bottom of the via hole, and the via hole being filled with a conformal conductive layer of a first metal overlying the barrier layer to provide contact areas substantially coplanar with the surface of the first dielectric layer;

a second dielectric layer overlying the first dielectric layer and having a substantially planar surface, the second dielectric layer defining interconnect trenches therethrough, the interconnect trenches having steep sidewalls and being formed over selected contact areas of the first metal layer, the trenches being lined with a conformal layer of a conductive barrier material extending over the sidewalls and a bottom of each trench including over selected contact areas of the first conductive metal, and the interconnect trenches being filled with a conformal layer of a second conductive metal overlying the layer of conductive barrier material; and the barrier layer and the second metal layer having interfaces substantially coplanar with the surface of the second dielectric layer and forming electrically conductive interconnections to selected contact areas of the first metal layer.

Thus, the present invention provides an interconnect structure and a method of forming an interconnect structure for an integrated circuit which avoid or overcome the above mentioned problems.

BRIEF DESCRIPTION OF THE DRAWINGS

Embodiments of the invention will now be described by way of example, with reference to the accompanying drawings, in which:

FIG. 1a to 1g show a schematic cross-sectional view through part of an integrated circuit structure at successive stages in a method of forming an interconnect structure for an integrated circuit according to a first embodiment of the present invention;

FIGS. 3a to 3g show a schematic cross-sectional view through part of an integrated circuit structure at successive stages of method of forming an interconnect structure for an integrated circuit according to a third embodiment of the present invention.

DESCRIPTION OF THE PREFERRED EMBODIMENTS

Figure 2A:
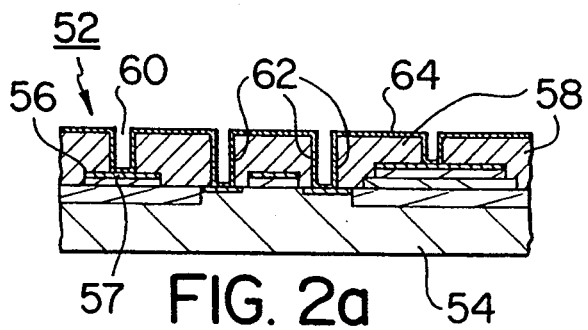
FIGS. 2a to 2g show a schematic cross-sectional view through part of an integrated circuit structure at successive stages of method of forming an interconnect structure for an integrated circuit according to a second embodiment of the present invention.

In a method of forming an interconnect structure for an integrated circuit according to a first embodiment of the present invention, as shown in FIGS. 1a to 1g, a substrate 12 was provided comprising a silicon semiconductor wafer 14 having parts of a partially fabricated integrated circuit defined thereon, including a first conductive layer 16 forming conductive regions 16a–16d of underlying device structures, and an overlying surface layer 18 of an insulating dielectric material, having a substantially planar surface 30. The dielectric layer 18, is patterned to define steep sided contact via holes 20 therethrough (FIG. 1a) exposing regions 17 of the conductive layer 16 in the bottom of each via hole. Where the underlying topography of the first conductive layer 16 is non-planar, dielectric planarization may be performed by a conventional method, e.g., plasma etching of a sacrificial resist; a spin-on glass layer; or by chemical mechanical polishing. The via holes 20 were provided in the dielectric layer by a conventional known method. For example, after chemical vapour deposition of a dielectric layer 18 of silicon dioxide, the layer 18 was coated with photoresist material, patterned and anisotropically etched, i.e., by reactive ion etching, to define contact via holes 20 having steep side walls 22.

After stripping the photoresist from the dielectric layer 18, a conformal layer 24 of a suitable conductive barrier material, i.e., titanium nitride, TiN, was provided overall by a conventional known method, e.g. by sputtering or chemical vapour deposition. TiN was deposited by collimated sputtering to form a thin conformal layer, i.e. of substantially uniform thickness, about 300 Å to 800 Å thick over the sidewalls and the bottom of the trench, and over the surface of the dielectric layer. Collimated sputtering provided for deposition of a conformal layer of TiN even in high aspect-ratio deep trenches (for example trenches with depth to width ratios >3).

A conformal metal layer 26, i.e., copper, was then deposited overall over the TiN barrier layer 24, to a sufficient thickness to fill the contact via hole, as shown in FIG. 1b. The layer of copper was deposited by a method of low temperature chemical vapour deposition from an organo-metallic (OM) precursor: a suitable material for OM-CVD deposition of copper is copper (hexafluroacetylacetonate) trimethylvinyl silane, available commercially as Cupra-Select ™, manufactured by Air Products and Chemicals Inc., which is a volatile liquid source reagent from which copper may be selectively deposited on a suitable seed layer by a disproportionation reaction at low temperature. A layer of copper may be deposited on a suitable seed material with high selectivity relative to silicon dioxide or other dielectric materials as described in an article entitled "New OM CVD Precursors for Selective Copper Metallization" by John Norman et al., IEEE VMIC Conference Proceedings, Jun. 11–12, 1991, Abstract No. TH 0359-0/91, pages 123 to 129. Suitable seed layers for deposition of copper, which also form conductive barrier layers, include, for example, TiN, W, Ta, or Al. Thus a conformal layer of copper 26 was deposited overall on the TiN barrier layer 24 to a sufficient thickness to fill the via holes, i.e. from 0.25 to 0.5 $\mu$m to fill submicron via holes. Preferably, copper deposition was carried out at temperatures between 100° C. to 300° C., the flow rate of the copper precursor vapour was from 30 to 400 sccm in an inert carrier gas comprising argon, and at a pressure of 0.1 to 20 Torr, to provide a deposition rate of 100 to 200 nm/min. The resulting copper layer extended over the surface of TiN layer on the substrate to provide a blanket layer of copper 26.

The copper layer 26 and the TiN barrier layer 24 were then etched back level with the planar surface 30 of the dielectric layer 18 by a step comprising chemical mechanical polishing (CMP) to leave parts 28 of copper layer 26 filling in the contact via holes as shown in FIG. 1c. Chemical mechanical polishing was achieved with conventional commercially available polishing slurries. For example, a suitable slurry comprises silicon dioxide, aluminium oxide and cesium oxide in a stabilized, pH adjusted, acid medium. The CMP slurry was found to remove the surface copper layer 26 and TiN barrier layer satisfactorily from the dielectric layer 18 without need for a hard mask over the dielectric surface 30.

Thus, electrically conductive contacts were formed between the copper 28 and the underlying conductive layer 16, through the barrier layer 24 in region 17 in the bottom of each contact via hole, and copper contact areas 31 were exposed on the substantially planar surface 30 of the first dielectric layer 18.

A first level of copper interconnect was then formed by a similar series of process steps as follows: A second dielectric layer 32, for example, another layer of silicon dioxide, was deposited by a conventional method of CVD. If necessary, the second dielectric layer is planarized conventionally to provide a substantially planar dielectric surface 33 by a method as described above. Then, metal interconnect trenches 34 were opened as shown in FIG. 1d, by a conventional method of selective masking and an anisotropic dielectric etch process, as described above for forming contact via holes. The second dielectric layer 32 thus defines steep sidewalls of each interconnect trench and selected contacts 31 of the first conductive layer are exposed in the bottom of each trench. A second conformal conductive barrier layer 36, comprising TiN, was deposited overall (FIG. 1e) by collimated sputtering. A second conformal metal layer 38 comprising copper was then deposited over the barrier layer, to a sufficient thickness to fill the trenches 34, as shown in FIG. 1f. The conformal copper layer 38 was deposited by OM CVD, as described above, from copper (hexafluoroacetylacetonate) triethylvinyl silane to form a blanket layer over the surface of the second dielectric layer. The copper layer 38 and parts of the barrier layer 36 extending over the planar surface 33 of the second dielectric layer were etched back to the level of the planar surface 33 of the dielectric layer 32 using CMP, thereby forming a fully planarized surface with parts 40 of the copper layer 38 forming interconnect patterns within the trenches 34, as shown in FIG. 1g. Thus the resulting pattern of copper interconnect conductors 40 provides conductive paths to selected individual devices of the integrated circuit through the copper filled contact vias 28.

The latter process steps as shown in FIG. 1d to 1g were then repeated to provide second and subsequent layers of copper interconnect, as required. Thus a multilevel interconnect structure having copper conductors is provided.

Figure 2B:
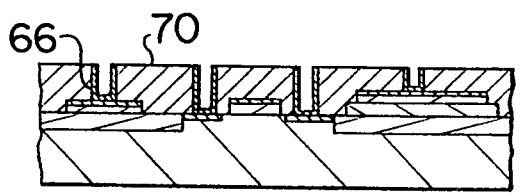
Figure 2C:
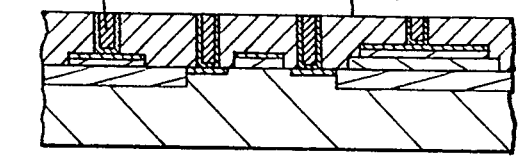

In a method of providing an interconnect structure for an integrated circuit according to a second embodiment of the present invention, as shown in FIGS. 2a to 2g, a substrate 52 was provided which was similar to the substrate 12 of the first embodiment. The substrate comprised part of a silicon wafer 54, having parts of a partially fabricated integrated circuit defined thereon, and including a first conductive layer 56 and an overlying dielectric layer 58 defining steep sided contact via holes 60 therein with a region 57 of the conductive layer 56 exposed within a bottom of the via hole 60. As in the method of the first embodiment, the substrate was provided with an overall thin layer (~300 to ~800 Å) of TiN 24 to form a conductive barrier layer (FIG. 2b) extending over the sidewalls 62 and the bottom 63 of the via holes 60 and over the surface 70 of the dielectric layer 58. However, subsequent method steps differed from the first embodiment. After deposition of the conformal barrier layer 64 of TiN, the barrier layer 64 was etched back using chemical mechanical polishing thereby selectively removing the TiN layer 64 from the surface 80 of the dielectric 56, and leaving the TiN layer 64 only on sidewalls and bottom of the via hole. As is conventional in known CMP processes, the CMP process comprised a cleaning step after polishing, e.g., in an ultrasonic bath of a suitable cleaning solution which removes polishing debris which may accumulate within the via holes during the polishing step. A conventional known CMP process slurry was found to be satisfactory for removing TiN from the surface 70 of the dielectric layer 58 of silicon dioxide. As shown in FIG. 2b, after CMP, part 66 of the TiN barrier layer 64 remains intact on the sidewall and at the bottom of each contact via hole 60 (FIG. 2b). A conformal conductive layer 68 of copper was subsequently deposited selectively on the TiN layer 66 in the via hole 60 by CVD from copper (hexafluoroacetylacetonate) trimethylvinyl silane, as described in the first embodiment above. However, since the conformal layer 66 of TiN within the via hole provides a seed layer for the growth of copper by selective deposition from the organo-copper precursor, copper is deposited selectively in the via holes. A conformal layer of copper was deposited on the seed layer of TiN to a sufficient thickness to fill the via hole 60 level with the dielectric surface 70 of the substrate (FIG. 2c), thus forming a first layer of copper 68 to provide electrical connections to the underlying conductive layer 56. If required, another planarization step, i.e., by CMP, after copper deposition removes excess copper from the dielectric surface. However, the deposition of copper on the seed material, i.e. TiN, in the via holes is selective relative to the dielectric, and where the dielectric is silicon dioxide, copper does not deposit significantly on the surrounding dielectric surface 70. Thus, the extent of etching back of excess copper is minimized.

Figure 2D:
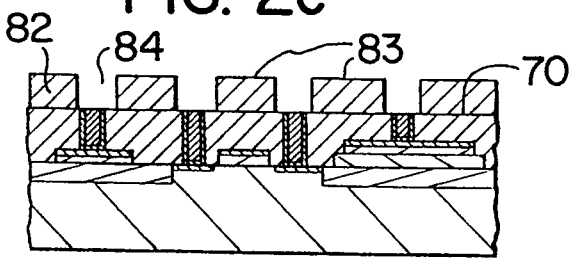
Figure 2E:
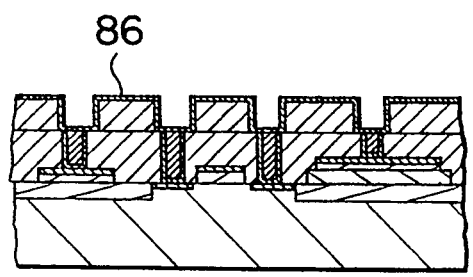
Figure 2F:
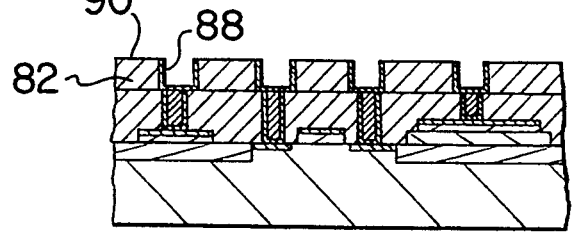
Figure 2G:
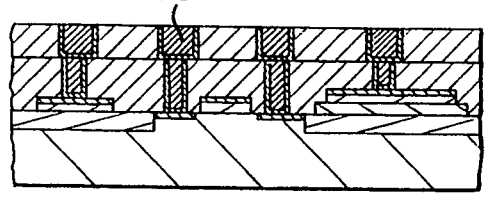

Subsequently a second dielectric layer 82 having a substantially planar surface 83 was provided, and interconnect trenches 84 were opened in the second dielectric layer, as shown in FIG. 2d, by a conventional known method, for example, as described above for the first embodiment. A second conformal barrier layer 86 of TiN was deposited overall on the surface of the dielectric, as shown in FIG. 2e, and then etched back using CMP to remove the TiN layer 86 selectively from the surface 90 of the dielectric 82. Parts 88 of the TiN layer at the bottom and on the sidewall of the trenches 84 remain intact (FIG. 2f). After cleaning, the trench was selectively filled by a step of selective deposition of a conformal layer of copper, as already described, to form copper interconnect patterns 92 as shown in FIG. 2g, with copper selectively filling the trenches 84 level with the surface 90 of the second dielectric layer. If required a further step of CMP removes any excess copper and fully planarizes the surface of the resulting structure.

The latter process steps as shown in FIGS. 2d to 2g, were repeated to form second and subsequent levels of copper interconnect, as required.

Selective deposition of a conformal layer of copper by OM CVD provides the advantage that contact holes and trenches of different widths and depths can be filled by the selective metal deposition on the seed layer of barrier material within a trench or via hole. Blanket deposition of a thick layer of metal overall to fill individual via holes or trenches is not necessary, and deposition of metal on the surrounding surfaces of the dielectric layer is minimized or avoided altogether. Thus etching back of an excess surface layer of copper is minimized.

In a method of forming an interconnect structure for an integrated circuit according to a third embodiment, as shown in FIGS. 3a to 3g, a substrate 112 was provided which was similar to that for the method of the first and second embodiments, comprising a silicon semiconductor wafer 114 having parts of a partially fabricated integrated circuit defined thereon, including a first conductive layer 116 forming conductive regions 116a–d of underlying device structures, and an overlying surface layer 118 of an insulating dielectric material. The dielectric layer 118 was provided with a substantially planar surface and via holes 120 were provided in the dielectric layer by a conventional known method, as described above (FIG. 3a) exposing regions 117 of the conductive layer 116 in the bottom of each via hole.

A conformal layer 124 of a suitable conductive barrier material, i.e. tungsten silicide, was deposited overall by a conventional known method, e.g., chemical vapour deposition. Tungsten silicide was deposited by CVD to provide a uniform thin layer of a thickness of 300 Å to 800 Å, over the sidewalls and the bottom of the trench, and over the surface of the dielectric layer. The tungsten silicide was then preferentially removed from the surface of the dielectric layer, for example, by chemical mechanical polishing, or by a conventional method such as anisotropic reactive ion etching, as described in the U.S. Patent to Ho, cited above (FIG. 3b). Thus a thin conformal layer of tungsten silicide was provided selectively over the sidewalls and bottom of the contact via holes.

A conformal layer 128 of tungsten was then deposited selectively on the tungsten silicide barrier layer 124, i.e., over the bottom and sidewalls of each contact via hole, to a sufficient thickness (i.e. in this example 0.25 to 0.5 $\mu$m) to fill the contact via hole, as shown in FIG. 1b level with the surface 130 of the dielectric layer 118. If required, any excess thickness of the tungsten layer 128 was etched back, to the level of the planar surface 130 of the dielectric layer 118 to leave the tungsten plugs 128 filling in the contact via holes as shown in FIG. 3c.

Thus, electrically conductive contacts are formed between the tungsten 128 and the underlying conductive layer 116, through the barrier layer 124 in region 117 in the bottom of each contact via hole, and tungsten contact areas 129 are exposed on the substantially planar surface 130 of a first dielectric layer 118 (FIG. 3c).

A first level of copper interconnect was then formed by a series of process steps, similar to those described for forming interconnect by the method according to the second embodiment, as follows. A second, dielectric layer 132, for example, a layer of silicon dioxide was deposited by a conventional method of CVD. The second dielectric layer was planarized if necessary, to provide a substantially planar dielectric surface 133. Then, interconnect trenches 134 were opened in the dielectric layer as shown in FIG. 3d, by a conventional method of selective masking and an anisotropic dielectric etch process, as described above for forming contact via holes and trenches. Thus selected tungsten contact areas 129 were exposed in the bottom of each interconnect trench. A second barrier layer 136, comprising a thin conformal conductive layer of TiN, was deposited overall (FIG. 3e). The barrier layer was selectively removed from the surface 130 of the dielectric layer by chemical mechanical polishing, as described in the second embodiment (FIG. 3f). A conformal metal layer 138 comprising copper was deposited over the barrier layer 136, to a sufficient thickness to fill the interconnect trenches 134, as shown in FIG. 3f. The conformal copper layer 138 was deposited selectively in the trenches by OM-CVD, as described above, from copper (hexafluoroacetylacetonate) trimethylvinyl silane. Although copper is not significantly deposited on the dielectric surface 130, if required any excess copper layer 138 extending over the planar surface 133 of the second dielectric layer was etched back to the level of the planar surface 133 of the dielectric layer 132 using CMP, thereby forming a fully planarized surface with parts 40 of the copper layer 138 forming interconnect patterns within the trenches 134, as shown in FIG. 3g. Thus the resulting copper interconnect conductors provide conductive paths to selected individual devices of the integrated circuit through tungsten contact vias.

The latter process steps, including deposition of another layer of dielectric, patterning and opening of trenches, lining the trenches with a conformal barrier layer and filling the trenches selectively with a conformal layer of copper, as shown in FIGS. 3d to 3g, were repeated to provide second and subsequent layers of copper interconnect, as required. Thus a multilevel interconnect structure having tungsten vias and copper interconnect conductors was provided.

In a method according to a fourth embodiment (not shown), the method is similar to that of the third embodiment except that the tungsten plugs 128 are provided to fill the contact via holes by a method of nonselective deposition of a layer of tungsten overall, followed by etch back, preferably by chemical mechanical polishing, the tungsten being deposited, for example, by a method as described in copending U.S. patent application Ser. No. 875,960, filed Apr. 30, 1992 to I. T. Emesh entitled "Deposition of Tungsten". The tungsten is etched back by a conventional method such as reactive ion etching by exposure to a plasma generated from $SF_6$ or by chemical mechanical polishing to leave tungsten plugs filling the contact via holes. Subsequent steps for providing first and second levels of copper interconnect are carried out as in the method of the third embodiment.

In modifications of the embodiments, other suitable contact barrier materials, instead of TiN, are used as seed materials for growth of copper. Refractory metal compounds, including WN, TiW and $TiB_2$; and refractory metals, including tantalum and molybdenum, provide suitable seed materials for growth of copper which are conductive, function as barrier materials to restrict interfacial diffusion across the contact region, and provide satisfactory contact resistance. Similarly, suitable seed materials other than tungsten silicide which are known to provide conductive barrier layers may be selected for formation of tungsten contacts or selective deposition of other metals.

The dielectric layer is formed from conventional known dielectric materials, for example, silicon dioxide, silicon nitride, silicon oxynitride, or other inorganic and other organic dielectric materials including organic dielectric polyimides.

As is conventional in CMP, the dielectric layer may comprise a hard masking layer of a material which is relatively resistant to the chemical-mechanical polishing step. The hard masking layer may be deposited on the surface of a relatively soft dielectric layer such as silicon dioxide, to provide a polish stop layer during CMP of the overlying metal layer. If a hard material such as tungsten is to be etched back by CMP, a hard masking layer of silicon nitride is desirable. However, in the embodiments described using copper metallization and silicon dioxide dielectric, the copper forms a relatively soft conductive layer, and it was found that a hard masking layer on silicon dioxide was not necessary.

Although copper is a preferred metal for forming multilevel interconnect structures because of its high conductivity and resistance to electromigration, methods according to alternative embodiments of the invention provide for formation of interconnect for integrated circuits using other suitable conductive materials. Other conductors of interest for ULSI integrated circuit applications include silver and gold. Preferably, metals which have suitable organic-metallic precursor materials may be deposited by OM CVD at low temperature, to provide a conformal layer for filling deep, high aspect-ratio narrow (i.e. sub-micron width) trenches. Alternatively these metals, including copper, may be deposited using collimated sputtering, followed by etch back by CMP which enables a uniform layer or coating of copper or other metal to be provided in high aspect-ratio deep via holes (depth to width ratio >3).

By providing a conformal layer of conductive material, i.e. a layer of a metal which can be deposited to a substantially uniform thickness with high step coverage so as to conform with the underlying topography, and preferably by a method of deposition selectively within the via holes or trenches, problems with dry etching of copper, or etching back excess blanket layers of other metals are avoided. Furthermore, chemical mechanical polishing is preferred over conventional known dry etching methods, using reactive ion or plasma processes, to provide a fully planarized topography. Thus a multilevel metal interconnect can be provided without exacerbating topography related photolithographic problems.

What is claimed is:

1. A method of forming interconnect structures for devices of an integrated circuit, the devices being formed in a substrate and having an overlying substantially planar first dielectric layer, the dielectric layer having contact holes extending therethrough over contact regions of the devices, the contact holes being filled with conductive material to provide contacts, the method comprising:

providing a second dielectric layer having a substantially planar surface and defining therein interconnect trenches having steep sidewalls, each interconnect trench extending through the second dielectric and exposing selected contacts within a bottom of the trench;

providing a conformal layer of a conductive barrier material selectively over sidewalls and the bottom of each interconnect trench, by depositing a conformal layer of the barrier material overall and then selectively removing barrier material from the surface of the second dielectric layer by chemical mechanical polishing thereby leaving a layer of the barrier material lining the sidewalls and bottom of each interconnect trench;

and then filling the interconnect trenches with a conductive material by selectively depositing a conformal layer of a conductive material on the barrier layer to a thickness sufficient to fill each interconnect trenches.

2. A method according to claim 1 wherein the conductive barrier layer provides a seed layer for selective growth of said conformal layer of conductive material within each trench and providing said conformal layer of conductive material over the barrier layer comprises chemical vapour deposition of a metal by disproportionation of an organo-metallic precursor of said metal.

3. A method according to claim 2 wherein chemical vapour deposition of a metal comprises deposition of copper by pyrolysis of a copper precursor comprising copper (hexafluoroacetylacetonate) trimethylvinyl silane.

4. A method according to claim 1 wherein the second dielectric layer is selected from the group consisting of silicon dioxide, silicon nitride, silicon oxynitride, and polyimide.

5. A method according to claim 1 wherein the layer of barrier material is selected from the group consisting of the refractory metals Ta and Mo, and the refractory metal compounds TiN, WN, TiW and $TiB_2$.

6. A method according to claim 1 wherein the step of depositing a conformal layer of conductive material to fill the interconnect trenches comprises selectively depositing a layer of metal selected from the group copper, silver and gold.

7. A method according to claim 1 comprising a subsequent step of chemical mechanical polishing to remove any excess conductive material overfilling the trenches or deposited on the planar surface of the second dielectric.

8. A method according to claim 1 wherein the step of chemical mechanical polishing to selectively remove barrier material from the surface of the second dielectric comprises cleaning the barrier layer lining the trenches to remove chemical mechanical polishing debris before the step of selectively filling the interconnect trenches with conductive material.

9. A method of forming interconnect structures for devices of an integrated circuit, comprising:

providing a substrate of an integrated circuit comprising a first dielectric layer having a substantially planar surface, the first dielectric layer having contact holes extending therethrough, each contact hole exposing in a bottom of the hole an electrically conductive region;

filling each of said contact holes with conductive material to provide contacts substantially coplanar with the planar surface of the dielectric layer;

providing a second dielectric layer having a substantially planar surface;

opening interconnect trenches in the second dielectric layer, each interconnect trench having steep sidewalls extending through the dielectric layer and exposing selected contacts within a bottom of the trench;

providing a conformal layer of a conductive barrier material selectively over sidewalls and bottom of each interconnect trench by depositing a conformal layer of the barrier material overall and then selectively removing the barrier material from the surface of the second dielectric layer by chemical mechanical polishing thereby leaving a layer of the barrier material lining the sidewalls and bottom of each interconnect trench;

then filling the interconnect trenches by selectively depositing on the barrier material in each trench, a conformal layer of a conductive material comprising a metal formed by chemical vapour deposition, the conformal layer of conductive material being selectively deposited over the barrier layer to a thickness sufficient to fill each of the interconnect trenches.

10. A method according to claim 9 wherein filling each of said contact holes with conductive material comprises:

providing a conformal layer of a conductive barrier material selectively over sidewalls and bottom of each contact hole;

and then providing a conformal layer of a conductive material comprising a metal formed by chemical vapour deposition of said metal, the conformal layer of metal being selectively deposited over the barrier layer to a thickness sufficient to fill the contact holes.

11. A method according to claim 10 wherein said metal comprises tungsten.

12. A method according to claim 10 wherein said metal comprises copper.

13. A method according to claim 9 wherein the barrier layer comprises a material which functions as a seed layer for subsequent selective deposition of the conformal metal layer by low pressure chemical vapour deposition from an organo-metallic precursor material of said metal, and the metal layer is thereby deposited selectively on said barrier layer.

14. A method according to claim 9 wherein the metal comprises copper and a conformal layer of copper is provided by low pressure chemical vapour deposition from an organo-metallic copper precursor material comprising copper (hexafluoroacetyl-acetonate) trimethylvinyl silane.

15. A method according to claim 14 wherein the metal deposition is carried out in the temperature range from 100° C. to 300° C. and at a pressure in the range from 0.1 to 20 Torr, and with the flow rate being controlled in the range from 30 to 400 sccm copper (hexafluoroacetyl-acetonate) trimethylvinyl silane in an inert carrier gas.

16. A method according to claim 9 wherein the second dielectric layer is selected from the group consisting of silicon dioxide, silicon nitride, silicon oxynitride, and polyimide.

17. A method according to claim 9 wherein the layer of barrier material selected from the group consisting of the refractory metals Ta and Mo, and the refractory metal compounds TiN, WN, TiW and $TiB_2$.

18. A method according to claim 9 wherein the step of depositing a conformal layer of conductive material to fill the interconnect trenches comprises selectively depositing a layer of metal selected from the group copper, silver and gold.

19. A method of forming conductive interconnect structures for an integrated circuit comprising:

providing a substrate of the integrated circuit comprising a dielectric layer having a substantially planar surface and having openings defined therethrough, each opening having steep sidewalls and exposing an underlying conductive region in a bottom of the opening;

providing a conformal layer of a conductive barrier material selectively over the sidewalls and bottom of each opening by depositing a conformal layer of the barrier material overall and then selectively removing the barrier material from the planar surface of the dielectric layer by chemical mechanical polishing, thereby leaving the layer of barrier material lining the sidewalls and bottom of each opening;

then selectively filling the openings with a conductive material by selective deposition of a conformal layer of the conductive material on the barrier layer to a thickness sufficient to fill each opening.

20. A method according to claim 19 wherein the conductive material is selected from the group of metals consisting copper, silver, gold or tungsten deposited by chemical vapour deposition.

21. A method according to claim 20 wherein the barrier layer forms a seed layer for said selective deposition thereon of the conformal layer of said metal.

* * * * *